United States Patent
Faulkner et al.

[11] Patent Number: 6,064,253
[45] Date of Patent: May 16, 2000

[54] MULTIPLE STAGE SELF-BIASING RF TRANSISTOR CIRCUIT

[75] Inventors: Mark V. Faulkner, Boulder Creek; Malkiat S. Nijjar; Clifford A. Mohwinkel, both of San Jose, all of Calif.

[73] Assignee: Endgate Corporation, Sunnyvale, Calif.

[21] Appl. No.: 09/063,425

[22] Filed: Apr. 20, 1998

[51] Int. Cl.[7] ........................................... G06G 7/26
[52] U.S. Cl. ............................. 327/560; 455/333
[58] Field of Search ................................... 327/427, 434, 327/436, 560, 365, 77, 530; 340/825.69, 825.72; 455/333

[56] References Cited

U.S. PATENT DOCUMENTS

| | | | |
|---|---|---|---|
| 4,952,827 | 8/1990 | Leipold et al. | 327/434 |
| 5,361,406 | 11/1994 | Wignot et al. | 455/200.1 |
| 5,648,739 | 7/1997 | Walther et al. | 327/436 |
| 5,754,074 | 5/1998 | Kelly | 327/427 |
| 5,809,410 | 9/1998 | Stuebing et al. | 455/333 |

*Primary Examiner*—Jung Ho Kim
*Attorney, Agent, or Firm*—Edward B. Anderson

[57] ABSTRACT

First and second spaced-apart planar circuit ground conductors are formed on a base substrate. Multiple stages of an amplifier each have a field effect transistor (FET) flip mounted onto the substrate. A signal-return line couples the sources of the FETs together and functions as a radio frequency (RF) grounds for the amplifier. Direct-current-blocking coplanar couplers couple the amplifier input and output to external circuits. A single voltage supply applies a bias voltage to the drains of the FETs. A source resistance device couples each source terminal to circuit ground. The source resistance devices may be formed of two series-connected resistors. The gate of each FET is coupled to one of the circuit ground conductors through one of the source resistors. The other source resistor thereby provides a gate-to-source voltage for biasing the FET. Alternative embodiments provide a community bias circuit in which signal-return lines of transistors conducting different signals are interconnected and coupled to the bias circuit ground.

7 Claims, 3 Drawing Sheets

MULTIPLE STAGE SELF-BIASING RF TRANSISTOR CIRCUIT

BACKGROUND OF THE INVENTION

The present invention relates to the field of transistor based radio frequency (RF) circuits, and in particular to such circuits having, collectively, multiple transistors with interconnected signal grounds, and that are each biased by current conducted by resistance devices coupling the transistors to ground.

Conventionally, a transistor is biased by applying a voltage to a current-carrying terminal, such as a drain of a field-effect transistor (FET), and a related bias to a control terminal, such as the gate, with the other current-carrying terminal, in this case the source, coupled to a common reference potential, such as ground. Other configurations are also possible, such as a common gate or common drain configuration.

Such conventional circuits require isolation between transistors and external circuits in order to isolate the bias voltages to each transistor. These designs require multiple voltage supplies. Additionally, a capacitor is required between the transistor and ground in order to maintain the bias on the transistor.

BRIEF SUMMARY OF THE INVENTION

The present invention provides a method and structure for self-biasing transistor circuits that allow for the use of a single bias source, no capacitor to the common reference voltage, all without degradation of the signal conducted by the transistors.

A multiple stage self-biasing RF transistor circuit according to the present invention comprises a reference potential, referred to conventionally as a circuit ground, and at least first and second transistors. Each transistor has respective first and second current-carrying terminals and a control terminal. The control terminal of each of the first and second transistors is coupled to circuit ground, and the first current-carrying terminals of the transistors are coupled together by an interconnect conductor. A voltage supply applies a bias voltage to the second current-carrying terminal of each of the transistors. A device providing resistance, also referred to as a resistance device couples each first current-carrying terminal to circuit ground.

The preferred embodiment of the invention is formed using coplanar structures on a planar dielectric substrate. First and second spaced-apart planar circuit ground conductors are formed around a portion of the circuit periphery on the substrate. Circuit input and output signal interfaces are mounted on the substrate, each of which includes a signal terminal and first and second signal-return terminals positioned on opposite sides of the signal terminal.

At least first and second field effect transistors (FETs) are flip mounted onto the substrate, each of which have a pair of first current-carrying or source terminals, a second current-carrying or drain terminal and a control or gate terminal. A circuit interstage coplanar transmission line, in the form of a coplanar waveguide (CPW), is formed on the substrate. The CPW has a signal line coupling the drain of the preceding FET with the gate of the succeeding FET, and a pair of coplanar signal-return lines positioned on opposite sides of the signal line. The signal-return lines couple the sources of the FETs together.

A direct-current-blocking coplanar coupler, also formed on the substrate, has a distributed capacitance device coupling the signal input terminal with the gate of the first FET. Similarly, a signal-return distributed capacitance device couples each of the signal-return terminals with a respective one of the signal-return lines of the CPW. A voltage supply applies a bias voltage to the drain of each of the FETs.

Source resistance devices couple the FET source terminals to corresponding circuit ground conductors. At least one of the source resistance devices associated with each FET includes two series-connected resistors. The gate of each FET is coupled to one of the circuit ground conductors through one of the source resistors.

A particularly advantageous feature of this invention is that the FETs are all self-biased. The current passing through a resistor between source and gate makes the source voltage greater than the gate voltage. The gate voltage is determined by a resistor having a selectable value and which couples the gate terminal to ground. Additionally, signal return lines of the planar transmission line, which are direct current (DC) isolated from the circuit ground, provide RF grounds for the signal which are separate from the circuit ground. Accordingly, a single bias supply can provide biasing for all of the transistors in the circuit. The self-biased FETs have pinched channels which provide efficient operation and the negative gate-to-source voltage lowers the current in the depletion-mode transistors without having to use a separate negative bias supply.

These and other features and advantages of the present invention will be apparent from the preferred embodiments described in the following detailed description and illustrated in the accompanying drawings.

DETAILED DESCRIPTION OF THE PREFERRED EMBODIMENTS OF THE INVENTION

Figure 1:
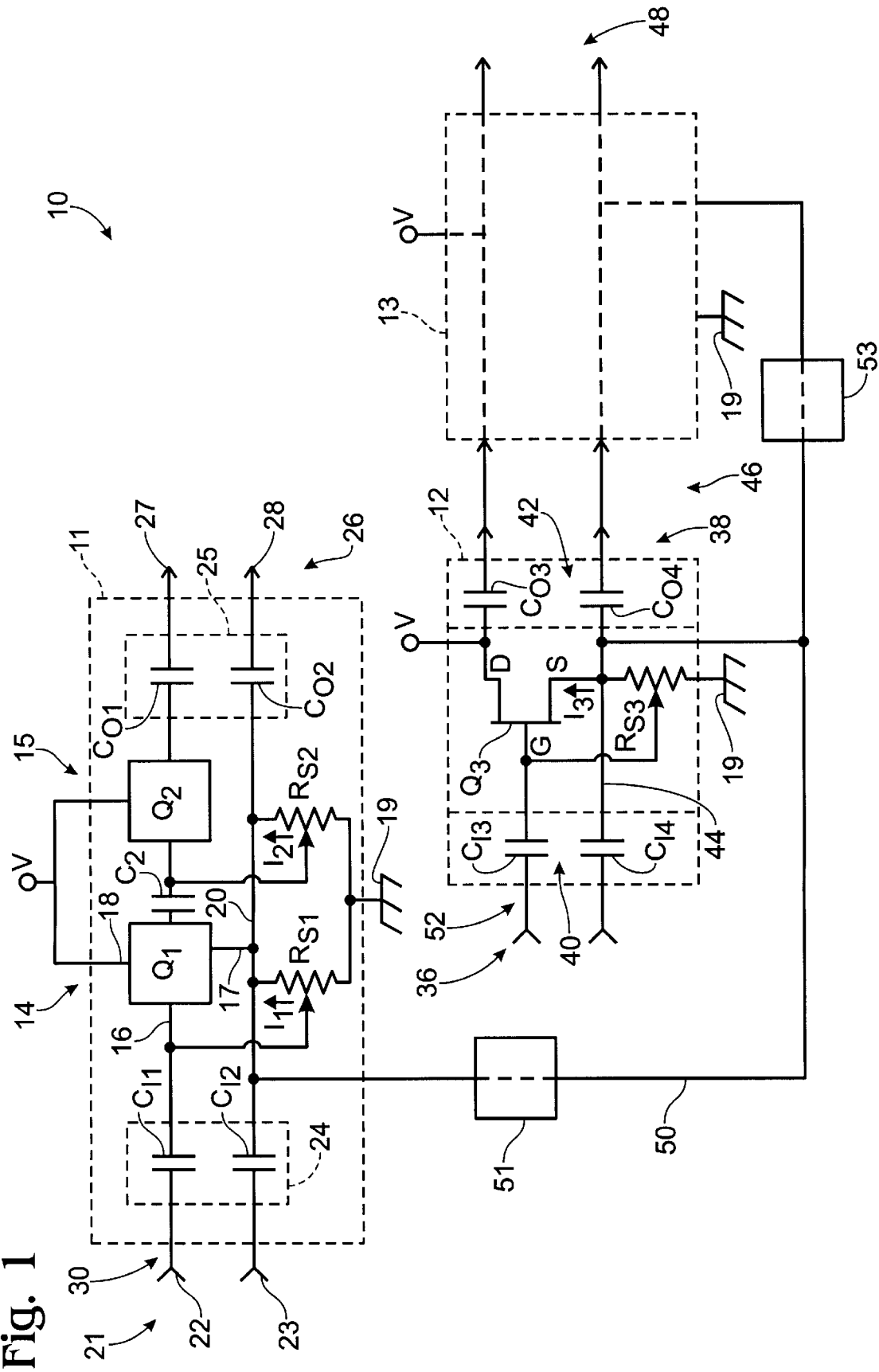
FIG. 1 is a general schematic of a self-biased, multiple stage circuit made according to the invention.

As has been mentioned, the invention provides a circuit for self biasing multiple transistors in one or more functional circuits, as shown by self-biasing circuit shown generally at 10 in FIG. 1. Circuit 10 is an exemplary circuit illustrating a couple of the ways different functional circuits can be structured as part of self-biasing circuit 10. In particular, three functional circuits 11, 12 and 13 are shown. Circuit 11 is a two-stage amplifier, circuit 12 is a single-stage amplifier, and circuit 13 is undefined. Circuits 11, 12 and 13 may be any functional circuit, such as a mixer, oscillator, power amplifier, or the like. Further, the RF signals conducted by these circuits may be related or unrelated. In FIG. 1, circuit 11 conducts a signal that is independent of the signal conducted by circuits 12 and 13.

Functional circuit 11 is a two-stage amplifier having a first, input stage 14 and a second stage 15. An indefinite number of stages may be used. Stages one and two shown here are exemplary. Stage 14 includes a first transistor $Q_1$, which may be a unijunction transistor, such as a FET, a bipolar junction transistor, or other type of transistor. Each transistor has a control terminal 16 and first and second current-carrying terminals 17 and 18. The second current-carrying terminal 18 is coupled to a common bias voltage supply V. The bias supply is applied to each stage of each functional circuit. The first current-carrying terminal of transistor $Q_1$ is connected to a circuit ground 19 via a self-biasing resistor, $R_{S1}$, also referred to generally as a first resistance. Control terminal 16 of the transistor is connected to the ground side of resistor $R_{S1}$ or at least to an intermediate portion of resistor $R_{S1}$ to provide a negative bias voltage between terminals 16 and 17 produced by a current $I_1$ flowing through resistor $R_{S1}$.

An in-line capacitor $C_2$ isolates the bias voltage applied to second current-carrying terminal 18 of the first transistor from control terminal 16 of the second transistor. It is seen that second stage 15 is formed like the first stage. In particular, a second self-biasing resistor $R_{S2}$, also referred to as a second resistance, couples the first current-carrying terminal of transistor $Q_2$ to ground and the control terminal of the transistor is connected to ground through a portion of resistor $R_{S2}$. The first and second self-biasing resistors are not necessarily of equal value.

A signal-return conductor 20 connects the first current-carrying terminals 18 of the transistors. As mentioned, this provides an RF signal-return path that is biased at the voltage of the first current-carrying terminals which is above the circuit ground by the voltage across the self-biasing resistors.

An input signal interface 21 for receiving an incoming radio frequency signal includes a signal terminal 22 and a signal-return terminal 23. An incoming signal is fed to first amplifier stage 14 via an input DC blocking coupler 24. Coupler 24 includes input capacitor $C_{I1}$ coupling signal terminal 22 with the control terminal of transistor $Q_1$. An input return coupling capacitor $C_{I2}$ couples common signal-return conductor 20 to signal-return terminal 23.

Accordingly, on the output is an output DC blocking coupler 25 having a signal output coupling capacitor $C_{O1}$ and a signal-return output coupling capacitor $C_{O2}$. Coupler 25 couples the last or Nth stage of the amplifier, or other circuitry associated with the circuit, to an output interface 26. Output signal coupler 25, similar to input coupler 24 and having a signal capacitor $C_{O1}$ and a signal-return capacitor $C_{O2}$, couples final stage 15 to external output circuits. Similar to input interface 21, output interface 26 includes a signal terminal 27 and a signal return terminal 28.

The signal conducted by circuit 11 travels along a signal path 30 extending from input interface 21, through input coupler 24, transistors $Q_1$ and $Q_2$ conductor 20 and output coupler 25 to output interface 26.

Circuit 12 is similar to circuit 11 except that it has a single stage 34 consisting of a field effect transistor (FET) $Q_3$ and the associated circuitry, including input and output interfaces 36 and 38, input and output capacitive couplers 40 and 42, self-biasing resistor $R_{S3}$, and a signal-return conductor 44. FET $Q_3$ has a gate G as a control terminal, a source S as a first current-carrying terminal, and a drain D as a second current-carrying terminal. The drain is connected to bias voltage supply V and the source is connected to signal-return conductor 44.

Circuit 13 is an undefined circuit having an input interface 46 and output interface 48. It may have any function so long as it contains transistor-based circuits similar to those shown in circuits 11 and 12 that are biased by a voltage supply V. An interconnect conductor 50 connects the respective signal-return conductors, such as conductors 20 and 44, thereby putting the first current-carrying terminals at the same bias voltage. In the general sense, interconnect conductor 50, also referred to as a bias conductor, is considered to include the respective signal-return conductors. In order to reduce crosstalk between the circuits, filters are provided on conductor 50 between the respective circuits, such as filter 51 between circuits 11 and 12 and filter 53 between circuits 12 and 13. These filters may be a series-L, shunt-C or other suitable filter that provides bias voltage continuity. With regard to circuits 12 and 13, a signal is conducted along a signal path 52 extending between input interface 36 and output interface 48.

In the case where the self-biased transistors are all FETs, the sources are all connected together by interconnect conductor 50, the drains and sources of the transistors are all connected in parallel and the self-biasing source resistors are connected in DC parallel. Accordingly, the voltage on all of the source resistors is also the same. The combined resistance $R_S$ of the parallel source resistors is:

$$R_S = \frac{1}{\sum_{j=1}^{N} \frac{1}{R_{Sj}}}$$

The current $I_j$ in any given transistor j then depends on the characteristics of that transistor relative to the other transistors, and the values of the respective drain and source resistors. The source voltage $V_S$ of all of the transistors is:

$$V_S = R_S \cdot \sum_{j=1}^{N} I_j$$

Figure 2:
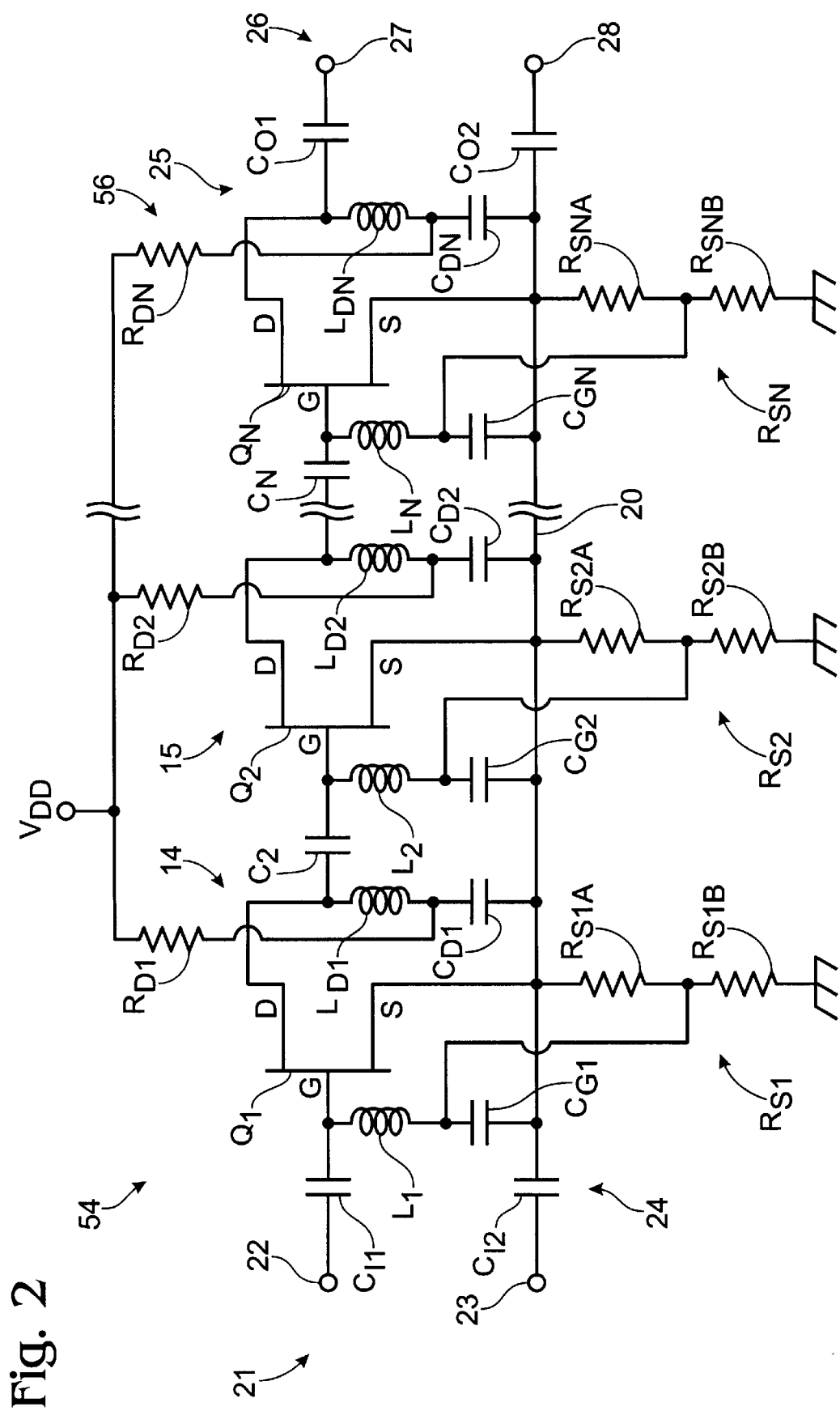
FIG. 2 is a schematic of a preferred embodiment of the invention.

Referring now to FIG. 2, the circuit schematic of a preferred embodiment of the invention is shown as an amplifier 54. Amplifier 54 could be a specific embodiment of functional circuit 11 shown in FIG. 1. Accordingly adopting the numbering used for circuit 11, a first amplifier stage is shown at 14, a second amplifier stage is shown at 15, and an Nth amplifier stage is shown at 56.

Each stage of the amplifier shown in FIG. 2 has the same configuration. The stages number from 1 to N, with N being a positive integer. The following description is for an arbitrary stage j, where j can be any number from 1 to N.

The incoming signal is received on the gate G of FET $Q_j$ via a coupling capacitor $C_j$. The drain D of the FET is coupled to bias voltage source $V_{DD}$ via a drain inductor $L_{Dj}$ and drain resistor $R_{Dj}$. The drain is coupled to source S via a capacitor $C_{Dj}$ connected in series with the drain inductor. The gate is coupled to the source via an inductor $L_j$ in series with a capacitor $C_{Gj}$.

The junction between inductor $L_j$ and capacitor $C_{Gj}$ is connected to a junction between two series source resistors $R_{SjA}$ and $R_{SjB}$, which together form a combined source resistor $R_{Sj}$. The combined source resistor device is also referred to as a resistance, and the series-connected source resistors, of which there could be more than two, are also referred to as resistance portions. These two resistors can be different, and they can be different for different amplifier stages. For any given FET $Q_j$, the gate-to-source voltage is $$V_{GSj} = V_S \cdot \left( \frac{R_{SjA}}{R_{SjA} + R_{SjB}} \right)$$

It will also be apparent to one skilled in the art that the source resistances for the various stages may be provided in various combinations of parallel and series connected resistors. These combinations can provide equivalent transistor bias. Thus, a single resistor can provide the equivalent resistance as multiple separate resistors as described herein. Also, some resistors described herein could be removed (have a resistance of zero ohms) for some applications, with the combined bias circuit still functioning according to the invention.

Figure 3:
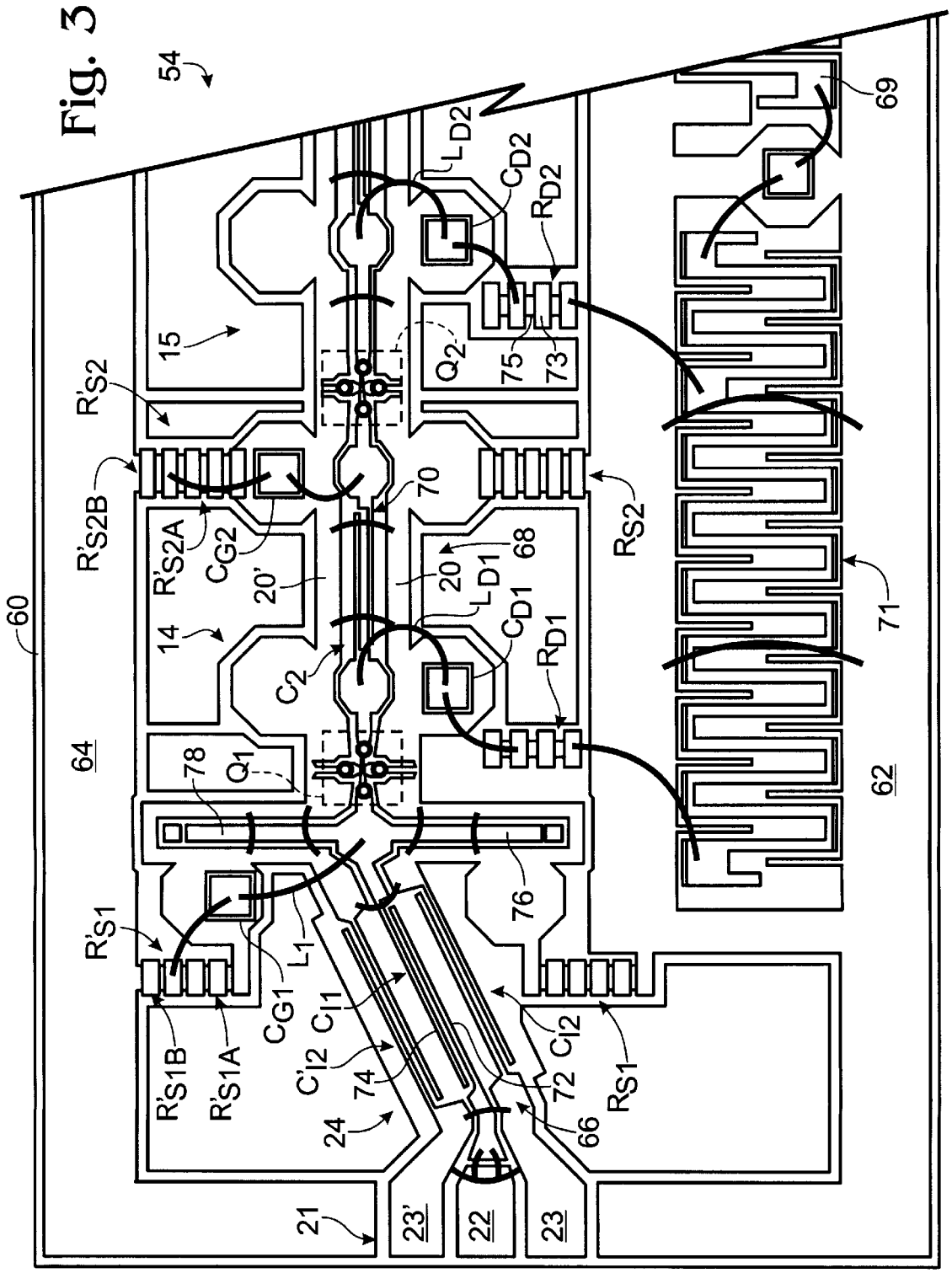
FIG. 3 is a plan view of a portion of a coplanar circuit embodying the circuit of FIG. 2.

FIG. 3 shows a plan view of the first two stages of amplifier 54 made as a coplanar circuit formed on a dielectric substrate 60. Although not shown, the output coupler 25 and output interface 26 are essentially mirror images of input interface 21 and input coupler 24. Input interface 21 includes signal terminal 22 and opposite signal-return terminals 23 and 23'.

Input interface 21 is part of what may be called an input transmission line 66 in the form of a coplanar waveguide. Although the preferred embodiment is formed with transmission lines in the form of coplanar waveguides, it will be apparent to one skilled in the art that the invention also can be embodied with other forms of transmission lines, such as microstrip lines and slotlines. As is well known, coplanar waveguides include a central signal conductor separating oppositely disposed ground or signal-return conductors. This is also particularly shown by an intermediate, interstage transmission line 68 coupling the first amplifier stage to the second amplifier stage. As a coplanar waveguide or CPW, transmission line 68 includes a central signal conductor, shown generally at 70, and signal-return conductors 20 and 20'. Opposite side conductor 20' is given the same base reference number as is used in FIG. 2 but with an added prime to illustrate the correspondence of the component in the coplanar waveguide embodiment, as shown. FETs $Q_1$ and $Q_2$ are preferably in the form of flip-mounted GaAs chips represented by the dashed outline in the figure. The drain bias supply $V_{DD}$ is applied at a drain bias supply terminal 69.

The bias supply is preferably applied via an RF lossy bias circuit 71. The structure and function of circuit 71 is further described in commonly owned U.S. application Ser. No. 675,931 filed on Jul. 5, 1996. Any well known bias supply circuit is also acceptable. It is also seen that the value of the various resistors are individually selectable by placement of respective bond wires on selected ones of the associated series of contact pads, such as pad 73 on resistor strip 75 used for resistor $R_{D2}$.

Input coupler 21, forming a portion of CPW 66, includes a central conductor formed as distributed capacitor $C_1$ and opposite signal-return conductors in the form of distributed capacitors $C_{r2}$ and $C'_{r2}$. These distributed capacitors are formed of parallel, reduced-size open-ended conductor segments, such as segments 72 and 74 forming capacitor $C_{r1}$. The conductor segments pass signals having frequencies within a pass band determined by the size and spacing of the segments. By providing equivalent structure for the signal-return lines, satisfactory conductance of design frequencies are provided, in addition to providing DC isolation between the signal-return interface terminals 23, 23' and signal-return lines 20, 20'.

It should also be understood that the coplanar waveguides shown also preferably provide impedance matching. That is, CPW 66 provides impedance matching, such as with the use of tuning stubs 76 and 78. The interstage transmission lines also provide impedance matching between the drain of a prior stage and the gate of the succeeding stage. Impedance matching techniques are well known and are not described further here.

The features and advantages of a self-biasing amplifier circuit according to the invention are particularly apparent in the coplanar structure shown in the circuit of FIG. 3. The input signal-return terminals are directly connected to the circuit ground conductors which extend around the periphery of the balance of the circuit. These conductors are capacitively coupled to the signal-return conductors associated with the coplanar waveguides transmitting the radio frequency signals through the circuit. By isolating the signal-return conductors from circuit ground, the signal-return conductors are raised in voltage over the ground potential, thereby allowing for self-biasing of the FETs. The source resistors determine the source voltage, and the connection of the transistor gates to ground, or above ground but below the source voltage by connection to an intermediate position in the source resistance, device determine the gate bias voltage relative to the source voltage. As a result, the transistors are self-biased and the circuit is biased by a single positive bias voltage supply. A common source voltage exists on all of the transistors and the gates of each transistor are biased according to the selection of source resistance devices associated with the transistor. The separation of signal-return paths from circuit ground allows for the positioning of circuit elements between them for achieving the self-biasing function.

Although the present invention has been described in detail with reference to a particular preferred embodiment, persons possessing ordinary skill in the art to which this invention pertains will appreciate that various modifications and enhancements may be made without departing from the spirit and scope of the claims as written and as judicially construed according to principles of law. The above disclosure is thus intended for purposes of illustration and not limitation.

The invention claimed is:

1. A self-biasing RF circuit comprising:

a circuit ground;

at least first and second transistors each having respective first and second current-carrying terminals and a control terminal, the control terminal of each of said first and second transistors coupled to said circuit ground;

a bias conductor coupling the first current-carrying terminal of each of said first and second transistors together;

a voltage supply applying a bias voltage to the second current-carrying terminal of each of said first and second transistors;

at least one resistance device coupling said bias conductor to said circuit ground, said at least one resistance device including first and second resistance portions and the control terminal of one of said at least first and second transistors being coupled to said circuit ground through said second resistance portion of said at least one resistance device for biasing the control terminal of said one transistor relative to the first current-carrying terminal of said one transistor.

2. A circuit according to claim 1 further comprising first and second direct-current-blocking couplers, one coupler coupled to each end of a first portion of said bias conductor coupled to said first current-carrying terminal of said first transistor, said couplers and said first portion of said bias conductor forming a first signal-return path with said first portion of said bias conductor having a voltage level different than the voltage level of said circuit ground.

3. A circuit according to claim 2 further comprising third and fourth direct-current-blocking couplers, said third and fourth couplers coupled respectively to each end of a second portion of said bias conductor coupled to said first current-carrying terminal of said second transistor, said third and fourth couplers and said second portion of said bias conductor forming a second signal-return path with said second portion of said bias conductor having a voltage level different than the voltage level of said circuit ground.

4. A circuit according to claim 1 further comprising a dielectric substrate, and a first circuit coplanar transmission line formed on said substrate, said transmission line having a signal line coupling the second current-carrying terminal of said first transistor with the control terminal of said second transistor, and a coplanar signal-return line formed by said bias conductor.

5. A circuit according to claim 4 further comprising a circuit signal interface comprising a signal terminal and a signal-return terminal, the signal terminal being capacitively coupled to a terminal of one of said transistors and the signal-return terminal being capacitively coupled to said bias conductor.

6. A circuit according to claim 5 further comprising a direct-current-blocking coplanar coupler formed on said substrate and having a signal distributed capacitance device coupling the signal terminal with the terminal of said one transistor to which the signal-return terminal is coupled, and a signal-return distributed capacitance device coupling the signal-return terminal with the signal-return line of said transmission line.

7. A self-biasing RF circuit comprising:

a planar dielectric substrate;

first and second spaced-apart coplanar circuit ground conductors formed on said substrate;

a circuit signal interface mounted on said substrate comprising a signal terminal and first and second signal-return terminals positioned on opposite sides of the signal terminal;

at least first and second transistors mounted relative to said substrate, each of said transistors having a first current-carrying terminal, a second current-carrying terminal and a control terminal;

a circuit coplanar transmission line formed on said substrate, said transmission line having a signal line coupling the second current-carrying terminal of said first transistor with the control terminal of said second transistor, and a coplanar signal-return line positioned on each side of said signal line, the signal-return lines coupling respective ones of the first current-carrying terminals of each of said at least first and second transistors together;

a direct-current-blocking coplanar coupler formed on said substrate and having a signal distributed capacitance device coupling the signal terminal with the control terminal of said first transistor, and a signal-return distributed capacitance device coupling each of the signal-return terminals with a respective one of the signal-return lines of said transmission line;

a bias voltage supply coupled to the second current-carrying terminal of each of said at least first and second transistors;

a pair of resistance devices mounted on the substrate associated with each of said at least first and second transistors, each resistance device coupling a respective one of the first current-carrying terminals of said associated transistor to a respective one of said first and second circuit ground conductors, at least one of said resistance devices in each of said pairs of resistance devices including at least first and second resistance portions, and said control terminal of said associated transistor being coupled to one of said circuit ground conductors through said second resistance portion of said at least one of said resistance devices.

* * * * *